United States Patent [19]

Shearer

[11] 4,286,223
[45] Aug. 25, 1981

[54] WIDEBAND DIGITAL FREQUENCY DISCRIMINATOR AND PHASE AND FREQUENCY DETECTOR

[75] Inventor: Harry D. Shearer, St. Petersburg, Fla.

[73] Assignee: E-Systems, Inc., Dallas, Tex.

[21] Appl. No.: 78,916

[22] Filed: Sep. 26, 1979

Related U.S. Application Data

[63] Continuation-in-part of Ser. No. 906,030, May 15, 1978, abandoned.

[51] Int. Cl.³ .......................... H03D 3/18; H03K 9/06
[52] U.S. Cl. ...................................... 329/50; 307/526; 329/104; 329/107; 329/110
[58] Field of Search ................. 329/104, 107, 50, 126, 329/110; 307/232, 233 R; 328/134; 455/214; 375/80, 82, 94

[56] References Cited
U.S. PATENT DOCUMENTS 3,866,133  2/1975  Debloois et al. .................... 329/104
4,059,806  11/1977  Vagt, Jr. .............................. 329/107

Primary Examiner—Siegfried H. Grimm
Assistant Examiner—Edward P. Westin
Attorney, Agent, or Firm—Robert V. Wilder; Albert M. Crowder, Jr.

[57] ABSTRACT

A wideband digital discriminator for demodulating an FM signal is disclosed. An incoming FM signal cycles a counter through a series of sequential nonambiuous cyclical states. A timer is provided for producing a reference signal having a known relationship to the center frequency of the FM signal. First and second latches, synchronous with the timing means, are provided for sampling and storing information about the present and immediately preceding output states of the counter. A detector, operated synchronously with the reference signal, detects differences in magnitude and direction between the present and immediately preceding sampled states of the counter and generates an output signal when a state difference is detected. The output signal can be digitally processed or integrated over time to provide an analog discriminator output.

37 Claims, 16 Drawing Figures

WIDEBAND DIGITAL FREQUENCY DISCRIMINATOR AND PHASE AND FREQUENCY DETECTOR

This is a continuation-in-part of Ser. No. 906,030 filed May 15, 1978 and entitled "Wideband Digital Frequency Discrimination and Phase Frequency Detector", now abandoned.

TECHNICAL FIELD

This invention relates to digital discriminators and to phase and frequency detectors, and more particularly to wideband digital discriminators and phase and frequency detectors with improved linearity and stability.

BACKGROUND ART

Digital discriminators for FM signals of constant pulse width are widely used in linear systems. Problems typically encountered in such devices are that the bandwidth and center frequency are determined by tuned stages preceding the discriminator and the output voltages may be nonzero for zero frequency error. All of the above may be unstable with temperature.

Other types of frequency discriminators such as FOSTER-SEELEY, or ratio detectors, depend upon passband filters and circuit "Q" to determine both center frequency and the bandwidth. Both passband filters and circuit "Q" are temperature sensitive and lead to transfer function changes in the center frequency, dc output shifts, and slope changes in the df/dt vs. discriminator output curves.

In applications such as phase lock loop systems which have wide frequency ranges, the limited range of conventional phase detectors, $\pm\pi$ radians, require prepositioning if the starting point is more than $2\pi$ radians away from the frequency of the incoming signal. The prepositioning for the voltage control oscillator transfer function is nonlinear and, therefore, a potential problem.

Accordingly, there is a need for a frequency discriminator having high linearity and high stability in which transfer functions are stable with respect to temperature and frequency. There is likewise a need for a phase and frequency detector having an expanded range of operation.

DISCLOSURE OF THE INVENTION

The present invention is directed to providing a high resolution, highly stable wideband linear discriminator.

In accordance with one embodiment of the present invention, a wideband digital discriminator is provided for demodulating an incoming FM signal. A timing means is provided for producing a reference signal of known frequency. A counting means responsive to the frequency of the incoming signal generators a cyclical signal having recurring sequential nonambiguous states. A storage means synchronously operated by the timing means stores information about the present and immediately preceding sampled states of the cyclical signal generated by the counting means. A detection means, operated synchronously with the timing means, detects changes in magnitude and direction between consecutive sampled states and generates an output signal when a state change is detected. The output signal can then be digitally processed or used as an analog pulse which is input to an integrating means. The integrating means takes the time integral of the output pulses to obtain an analog discriminator output.

In accordance with yet another embodiment of the invention, an improved phase and frequency detector is provided by employing a conventional phase detector to detect phase differences less than $2\pi$ radians. The detector includes a timing means for producing a signal of center frequency. A first counting means responsive to the frequency of the incoming signal generates a cyclical signal having recurring sequential nonambiguous states. A storage means synchronously operated by the timing means stores information about the present and immediately preceding sampled states of the cyclical signal generated by the counting means. A detection means synchronously operated with the timing means detects changes in magnitude and direction between consecutive sampled states and generates an output pulse signal when a state change is detected. A second counting means responsive to the pulses generated by the detecting means counts the pulses which are fed to a conversion means to convert the output of the second counting means to an analog frequency difference signal. A phase detector detects phase differences between the incoming signal and the center frequency. A summing means is provided for summing the frequency difference signal and the output of the phase detector to obtain a finely tuned phase and frequency signal.

BRIEF DESCRIPTION OF DRAWINGS

For a more complete understanding of the present invention and advantages thereof, reference is now made to the following description taken in conjunction with the accompanying diagrams in which.

DETAILED DESCRIPTION

The present invention is directed to detection of differences in frequency and phase between incoming FM signals of frequency $f_x$ and a reference frequency $f_r$. The present invention provides a highly stable, highly linear wideband frequency discriminator. Operation of the discriminator is based on running a cyclical counter at frequency $f_x$, intermittently sampling the instantaneous state of the ring counter 20 at a frequency related to $f_r$ and comparing the present and immediately preceding sampled states to discern state changes caused by the buildup of a cumulative slip error between $f_x$ and $f_r$. Detection of state differences results in a signal being produced which is digitally processed or integrated into analog form to provide discriminator output. By including a conventional phase detector in the circuit, phase differences less than $2\pi$ radians are detectable to provide a combined phase and frequency signal indicative of phase and frequency differences between the incoming and a reference signal.

Wideband Digital Discriminator

Figure 1:
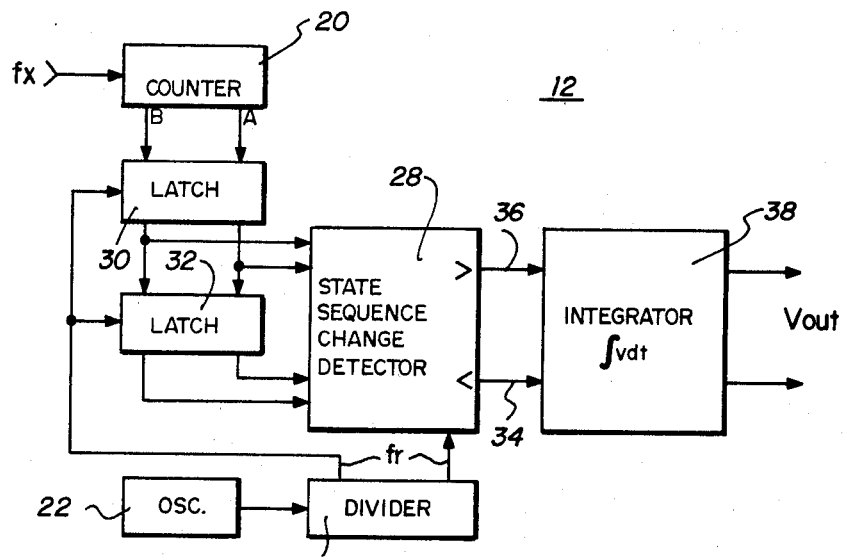
FIG. 1 is a block diagram illustrating a first embodiment of a wideband digital discriminator.

FIG. 1 is a block diagram illustrating a preferred embodiment of a wideband digital discriminator 12. An incoming signal of unknown frequency $f_x$ is received as a square wave or pulse train and input to the ring counter 20. Ring counter 20 has a finite number of output signal states which satisfy the criteria that there is no more than a single bit change between any two consecutive states and the direction of change between consecutive states is discernable. The simplest device which satisfies these criteria is a Johnson divide-by-four counter that cycles through four nonambiguous states which are generated synchronously with the unknown signal $f_x$. The Johnson divide-by-four counter is a two stage linear counter having two serially connected stages A and B in which the inverse of the second stage B is returned as input to the first stage A so that the counter cycles through four states, 0, 1, 2 and 3. States 0, 1, 2 and 3 are represented by the Johnson Code generated by counter 20 and are given in Table I.

TABLE I

| State | Counter Output B | A | Uncoded Binary |
|---|---|---|---|
| 0 | 0 | 0 | 0 0 |
| 1 | 0 | 1 | 0 1 |
| 2 | 1 | 1 | 1 0 |
| 3 | 1 | 0 | 1 1 |

As evident from the Table I, consecutive states of the Johnson divide-by-four counter differ by only a single bit change. Given any two consecutive states, it is possible to ascertain the direction of change.

Johnson divide-by-four counters have been constructed by connecting two J-K or two D flip-flops in series, inverting the output of the second flip-flop and returning it as input to the first. Details concerning Johnson counters and their construction may be found, for example, in Malvino and Leach, Digital Principles and Applications, pp. 219–221 (McGraw-Hill, 1969). A schematic diagram for a Johnson counter is described below.

Although a Johnson divide-by-four counter is the simplest way to implement the ring counter 20, it will be understood that other counters having two or more states and generating other codes, such as the Gray Code, may also be used.

A reference signal, $f_r$ is derived from a stable frequency source 22. Frequency source 22 may be a single frequency oscillator, preferably one which is tightly held through the use of an external crystal. By way of example, frequency source 22 may be an oscillator circuit such as MC 12061, manufactured by Motorola, with an external add on crystal which provides a tightly controlled square wave signal. The ability to vary the reference frequency, $f_r$ makes it possible to obtain discrimination relative to different reference frequencies as described hereinafter.

In the first embodiment, the oscillator 22 signal is input to divider 24 which divides by four to produce the reference signal $f_r$. Reference signal $f_r$ is transmitted to a state sequence change detector 28 and to a set of latches 30 and 32. Divider 24 may be constructed by dual D or J-K flip-flops such as TTL7474 and TTL7473 integrated circuits manufactured by Texas Instruments, in a manner well known in the art. See, e.g., Millman and Halkias, *Integrated Electronics*, pp. 639–641 (McGraw-Hill, 1972).

The information flow between successive elements of the discriminator circuit 12 is indicated by arrows, each arrow representing the transmission of one "bit" of information. Two arrows shown between successive elements indicate the transfer of the two "bits" of information required to specify the four nonambiguous states of counter 20. As shown in FIG. 1, information from counter 20 is transmitted to latches 30 and 32 which store the present and immediately preceding sampled states of the counter 20 for later comparison by the state sequence change detector 28.

The latches, 30 and 32, are each capable of storing two bits of information and retaining respectively, the Johnson Code representative of the present and immediately preceding states of counter 20. In some applications, latches 30 and 32 are implemented by, for example, a pair of flip-flops such as dual J-K or D flip-flops or a shift register and each is clocked at $f_r$.

The coded information in latches 30 and 32 is transferred to the state sequence change detector 28, likewise clocked at $f_r$. The particular hardware used to compare the information in latches 30 and 32 must be capable of arithmetically processing state information in the format in which it appears. Thus, the particular logic used in the state sequence detector depends upon the form in which information is input. For example, since a Johnson divide-by-four counter generates information in Johnson Code, the information must either be translated into a form compatible with the logic used in detector 28 or the logic of detector 28 must be able to accept and operate on information in Johnson Code. In the first embodiment, detector 28 is designed to accept information in Johnson Code.

Operation of the circuit is based on generating a cyclic state signal by the Johnson divide-by-four counter operating at the frequency of the incoming signal, $f_x$. When the incoming signal has the same frequency as the reference frequency, i.e., $f_x = f_r$, the recurrent update of latches 30 and 32 at $f_r$, will continually sample the same recurrent state of the Johnson counter 20 so that the information in latches 30 and 32 will be the same and no state change will be detected by the state change detector 28.

When the frequency of the incoming signal $f_x$ is less than that of the reference signal, i.e., $f_x < f_r$, the incoming signal will drive the counter 20 at a rate nonsynchronous with the sampling by the latches 30 and 32 at $f_r$. Eventually, the difference in frequencies, $\Delta f$, will cause a discernible state difference between latches 30 and 32 and this state difference will be detected by state sequence detector 28. Depending upon the direction of state change, a pulse will be output at the "less than" port 34 or the "greater than" port 36 of the detector 28.

Since the Johnson divide-by-four counter 20 has four sequential cyclical states, 0, 1, 2, 3; 0, 1, 2, 3; etc., the possible states of latches 30 and 32 at the time of a single state difference will be:

TABLE 2

| Latch 30 (Present State) | Latch 32 (Immediately Preceding State) |
|---|---|
| 0 | 1 |
| 1 | 2 |
| 2 | 3 |
| 3 | 0 |

Detection of any of these decreasing state changes by the state sequence detector produces a pulse on the "less than" port 34 of the detector 28. When the frequency of the incoming signal $f_x$ exceeds the reference frequency $f_r$, i.e., $f_x > f_r$, the frequency difference, $\Delta f$, will eventually build up to a state difference between latches 30 and 32 in the opposite direction. The states for latches 30 and 32 at the point of a single state difference will be:

TABLE 3

| Latch 30 (Present State) | Latch 32 (Immediately Preceding State) |
|---|---|
| 0 | 3 |
| 1 | 0 |
| 2 | 1 |
| 3 | 2 |

Detection of any of these increasing state differences produces a pulse on the "greater than" port 36 of the detector.

Since state sequence change detector 28 is capable of resolving only a single state change between successive sampled states, the discriminator cannot resolve frequency differences which cause more than a single sequential change in state information per sample period. The center frequency of the incoming FM signal $f_x$ is defined as $f_c$ and at this incoming frequency the discriminator produces a zero output signal. Because of $\Delta f$ in excess of $f_c/4$ will result in more than a single change in state between samplings, the first embodiment of the discriminator has a theoretical maximum linear bandwidth for signal $f_x$ of $f_c/2$, centered about $f_c$.

Figure 2:
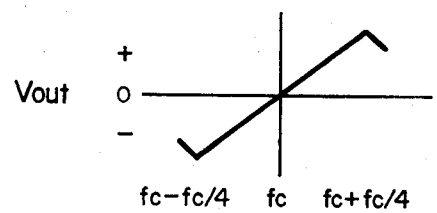
FIG. 2 is a graph of the transfer function of the digital discriminator of FIG. 1.

FIG. 2 shows the transfer function for the output of the discriminator of FIG. 1, $V_{OUT}$, as a function of frequency. The transfer function is linear over the bandwidth $\pm f_c/4$ centered at $f_c$.

The two output ports 34 and 36 of state sequence change detector 28 are input to an integrator 38 which is an active filter, an RC circuit designed to be compatible with the particular frequencies in use or a digital recursive integrator. Integrator 38 smooths the signal output from ports 34 and 36 into an analog discriminator output.

The counter 20 shown in FIG. 1 can be designed to have sequential outputs having two states or more. The limit of two states can be used only where the allowed bandwidth of the unknown signal $f_x$ and the relationship of this signal to the reference signal $f_r$ limit the deviation of the unknown signal $f_x$ to a unitary directional frequency change. The minimum number of states needed for bidirectional resolution by counter 20 is three. With three states a magnitude change of $\pm 1$ covers both increasing and decreasing frequency deviation. The preferred embodiment of ring counter 20 is as a four state Johnson counter since this implementation can readily be fabricated in a binary system. For linear transfer functions the use of four states however does not increase the maximum one state difference which can be obtained with a three state counter. A two state magnitude resolution can be implemented with a five state counter which includes a sign for the direction of frequency deviation.

In the discriminator 12 shown in FIG. 1 the outputs of state sequence change detector 28 indicate both direction (sign) and magnitude. Magnitude is indicated by the occurrence of a pulse on either line 34 or 36. The sign of the deviation is determined by the line, either 34 or 36, on which the pulse occurs. The information, magnitude and sign, generated at the output of the discriminator shown in FIG. 1 can be presented in other forms as well. For example the output can be presented as multiple levels on a single line or on a plurality of lines in either a serial or parallel format.

Figure 3:
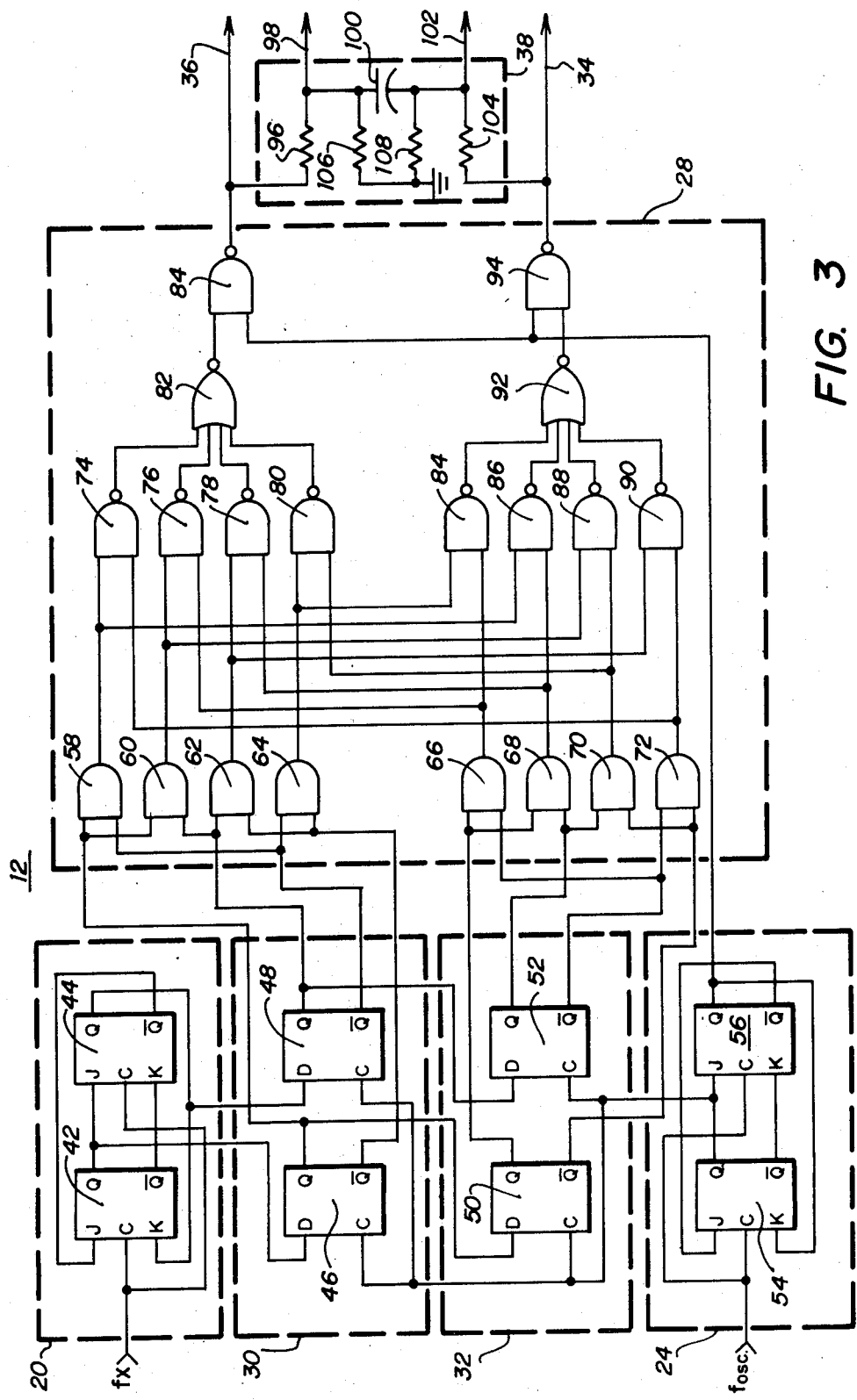
FIG. 3 is a schematic logic diagram of the digital discriminator illustrated in FIG. 1.

A logic schematic diagram of the discriminator shown in FIG. 1 is illustrated in FIG. 3. The incoming signal $f_x$ is input to the counter 20 which consists of J-K flip-flops 42 and 44. The $f_x$ signal is input directly to the clock terminals or flip-flops 42 and 44. The two flip-flops comprising counter 20 are connected to form a Johnson ring counter. The Q output of flip-flop 42 is connected to the J input of flip-flop 44 and the $\overline{Q}$ output of flip-flop 42 is connected to the K input of flip-flop 44. The Q output of flip-flop 44 is routed back to the K input of flip-flop 42 while the $\overline{Q}$ output of flip-flop 44 is routed to the J input of flip-flop 42. This configuration produces a four state cyclical output signal with each state generated when one cycle of the incoming signal $f_x$ is received.

The two outputs from counter 20 are input to latch 30 which comprises D-type flip-flops 46 and 48. The state signal outputs from counter 20 are input to the D terminals of flip-flops 46 and 48. The Q outputs of flip-flops 46 and 48 are connected to D-type flip-flops 50 and 52 which make up latch 32.

The divider 24 comprises two J-K flip-flops 54 and 56 which receive the oscillator signal and generate the reference signal $f_r$ which is provided to the clock terminals of latches 30 and 32 as well as the state sequence change detector 28. The Q output of flip-flop 54 is connected to the J terminal of flip-flop 56 while the output of flip-flop 54 is connected to the K terminal of flip-flop 56. In a feedback arrangement the Q output of flip-flop 56 is connected to the K input terminal of flip-flop 54 and in the same manner the $\overline{Q}$ output of flip-flop 56 is connected to the J input of flip-flop 54. The reference signal $f_r$ is tapped off from the Q output of flip-flop 54 and routed to the clock input terminals for each of flip-flops 46, 48, 50 and 52. The state sequence change detector 28 is a combination of logic gates which generates an output when a change in state is detected between latches 30 and 32. The state sequence detector includes a first set of AND gates 58-64.

The Q output signal from flip-flop 46 is connected to the first input terminals of AND gates 58 and 60 as well as to the D terminal of flip-flop 50. The $\overline{Q}$ terminal of flip-flop 46 is connected to the first input terminals of AND gates 62 and 64. From flip-flop 48 the Q output is connected directly to input terminals of AND gates 60 and 62 as well as the D terminal input of flip-flop 52. And, the $\overline{Q}$ output of flip-flop 48 is connected to the remaining input terminals of AND gates 58 and 64.

The state sequence change detector 28 has a second group of input AND gates 66-72. These gates are connected to the flip-flops within latch 32. The Q output of flip-flop 50 is connected to input terminals of AND gates 66 and 68 while the $\overline{Q}$ output of this flip-flop is connected to AND gates 70 and 72. The Q output signal from flip-flop 52 is connected to the input terminals of AND gates 68 and 70 while the $\overline{Q}$ output of flip-flop 52 is connected to the input terminals of AND gates 66 and 72.

The state sequence change detector 28 includes a third group of NAND gates 74-80 each of which has one input terminal connected respectively to the outputs of AND gates 58-64. The second input terminals of AND gates 74-80 are connected respectively to the output terminals of AND gates 72, 66, 68 and 70. The four outputs from NAND gates 74-80 are connected to the four input terminals of a NOR gate 82. The output of this gate is in turn connected to the first input of a NAND gate 84. The output from NAND gate 84 is transmitted over line 36.

A second group of NAND gates is included within state sequence change detector 28 and comprise logic gates 84-90. A first input terminal of each of gates 84-90 is connected respectively to the output terminal of AND gates 66-72. The second input terminal of NAND gates 84-90 are connected respectively to the output lines of AND gates 64, 58, 60 and 62.

Each of the outputs from NAND gates 84-90 are connected to input terminals of a NOR gate 92. The output of NOR gate 92 is connected to the first input of a NAND gate 94. The Q output of flip-flop 56 within divider 24 is connected to the second input terminals of NAND gates 84 and 94. The output of NAND gate 94 is transmitted through line 34.

The integrator circuit 38 is connected to receive the pulse outputs from NAND gates 84 and 94. The frequency difference signal from NAND gate 84 is connected through a resistor 96 to a first output terminal 98. A capacitor 100 is connected between output terminals 98 and 102. In a like manner the output signal from NAND gate 94 is connected through resistor 104 to terminal 102. A resistor 106 is connected between output terminal 98 and ground while a second resistor 108 is connected between output terminal 102 and ground.

The analog discriminator output signal is generated between terminals 98 and 102.

In operation, the discriminator circuit 12 of FIG. 3 generates an analog output signal which is proportional to the difference in frequencies between the unknown incoming signal $f_x$ and the reference signal $f_r$. The incoming signal $f_x$ is input to the ring counter 20 which is shown as a Johnson divide-by-four counter. The Johnson counter generates four nonambiguous sequential states over a pair of output lines. The states are generated at the same frequency as the incoming signal $f_x$. The four states are transmitted sequentially through latches 30 and 32 which are operated at a sampling rate synchronous with the reference signal $f_r$ from divider circuit 24. When $f_x$ is equal to signal $f_r$ the latches 30 and 32 will contain the same state of Johnson code, but if the $f_x$ and $f_r$ signals differ there will be a difference in states between latches 30 and 32. The state sequence change detector 28 monitors both of the latches 30 and 32 and generates an output pulse on line 36 when latch 30 contains one state in advance of latch 32. In a similar fashion the state sequence change detector monitors latches 30 and 32 to generate an output pulse on lines 34 when the state contained in latch 30 is retarded by one state from that in latch 32. The pulses generated on lines 34 and 36 are input to integrator 38 so as to positively or negatively charge capacitor 100 which is connected between output terminals 98 and 102. The output pulses are time averaged so as to produce a smooth output signal between lines 98 and 102. This output signal is proportional to the frequency difference between signals $f_x$ and $f_r$.

Figure 4:
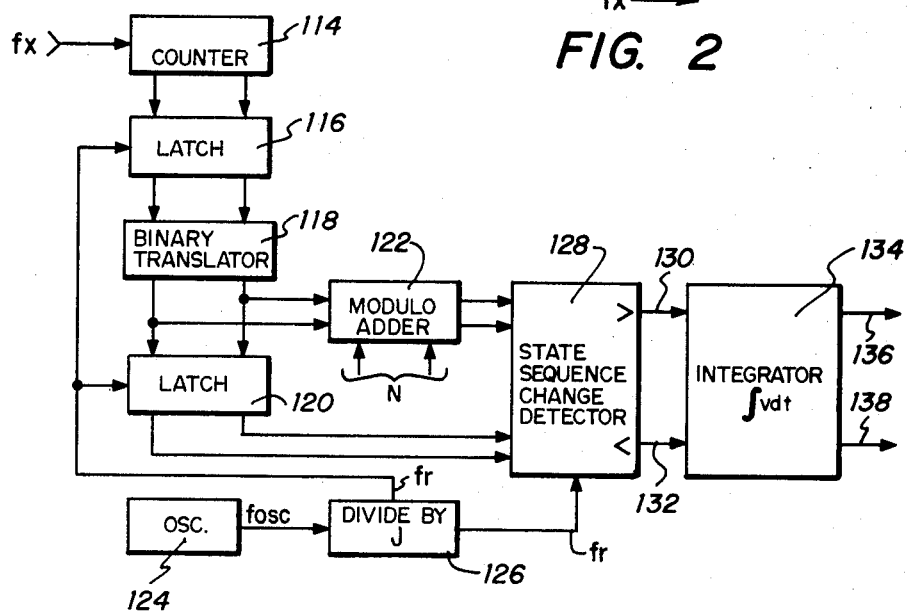
FIG. 4 is a second embodiment of a wideband digital discriminator having expanded bandwidth.

FIG. 4 is a block diagram illustrating a second embodiment of a discriminator which works substantially in the same way as the first embodiment, but which is modified to permit discrimination over bandwidths in excess of $\pm f_c/4$. The circuit of FIG. 1 is modified by the addition of a binary translator 118 which renders state information into a form more easily processed by arithmetic means. Still further added is modulo adder 122, which advances the apparent state of the counter 20.

In the embodiment of the present invention shown in FIG. 4 the incoming signal $f_x$ is input to a ring counter 114 which corresponds to the ring counter 20 in FIG. 1. Counter 114 generates a series of non ambiguous cyclical states which are transferred to a latch 116. The code produced by counter 114, a Johnson code in the preferred embodiment, is input to the binary translator 118 which converts the Johnson code into binary to simplify recognition of state sequence changes. The binary state sequences are transmitted from translator 118 to a second latch 120 as well as to the modulo adder 122. A modulo adder having a four state ring is preferred in this embodiment but such a circuit using modulo-arithmetic with other modulo numbers is within the scope of this invention. Modulo adder 122 receives a constant input N which is a "compensation constant". The modulo adder produces at the output terminals a state which is N states in advance of the state sequence received at the input terminals to the modulo adder.

An oscillator 124 generates a clock signal $f_{osc}$ and transmits this signal to a divide-by-J circuit 126 which produces a subdivided rate clock signal which is the reference signal $f_r$. The signal relationship is $f_r = f_{osc}/J$. The reference signal is transmitted to latches 116 and 120 to gate the operation of these latches.

A state sequence change detector 128 receives the advanced state signal from modulo adder 122 and the state retained in latch 120. State sequence change detector 128 is somewhat different from state sequence change detector 28 since it receives states which are in binary code rather than Johnson code. The ratio of the center frequency $f_c$ of signal $f_x$ to the reference signal $f_r$ is defined herein as K. The ratio is $K = f_c/f_r$. The frequency ratio K determines the rate at which the cyclical signal generated by the ring counter is sampled. If K=4 and the ring counter has four states then one state per cycle will be sampled and if K=2 then two states per cycle will be sampled. Similarly if K=1 then each state generated by the ring counter will be sampled when $f_x = f_c$.

The addition of the circuits utilizing the constants K and N give the discriminator of the present invention a wider linear bandwidth. With a given number of states generated by the ring counter, such as four in the embodiment shown in FIG. 4, one sample per cycle will occur when K=4 which is the case for the embodiment illustrated in FIG. 1. When the cyclical signal is sampled more frequently (K>1) the state sequence change detector cannot resolve state changes since there is more than one state change from the previous state. This problem is solved by the modulo adder circuitry which advances the state monitored by the state detector so that the apparent state has not changed. The relationship described is that the number of states generated by the ring counter equal the sum of the constants K and N for the condition that the state change sequence detector cannot fully resolve a greater than one state change.

Detector 128 generates a pulse on line 130 when the incoming signal $f_x$ advances the state transmitted through translator 118 and latch 120 in excess of N. Detector 128 generates a pulse on line 132 when the frequency of signal $f_x$ is less than that of the reference so as to retard the state signals transmitted through translater 118 and latch 120. The pulse output signals from state sequence change detector 128 are input to an integrator 134 which produces an analog discriminator output signal between terminals 136 and 138.

The bandwidth of the discriminator is increased by decreasing the value of K, that is, increasing the rate of the reference signal in relation to the center frequency $f_c$.

Thus, by applying different compensation constants N to modulo-adder 122 and by sampling the state of counter 114 at different rates using different values of K, it is possible to provide frequency discrimination over almost any desired bandwidth.

Figure 5:
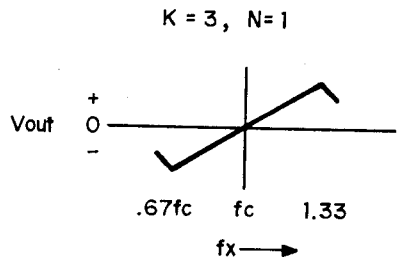
FIG. 5 is a graph of the transfer function for the discriminator of FIG. 4 having a frequency ratio constant $K=3$ and a one state compensation constant $N=1$.
Figure 6:
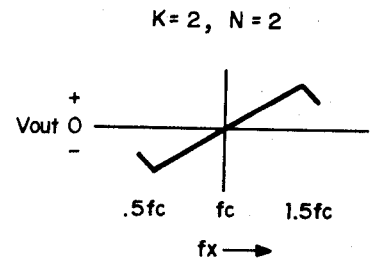
FIG. 6 is a graph of the transfer function for the discriminator of FIG. 4 having a frequency ratio constant $K=2$ and a compensation constant $N=2$.
Figure 7:
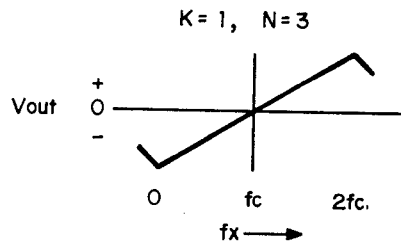
FIG. 7 is a graph of the transfer function for the discriminator of FIG. 4 having a frequency ratio constant $K=1$ and a compensation constant $N=3$.
Figure 8:
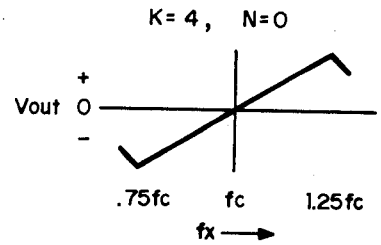
FIG. 8 is a graph of the transfer function for the discriminator of FIG. 4 having a frequency ratio constant $K=4$ and a compensation constant $N=0$.

This is illustrated by FIGS. 5-8, which show a wide variety of transfer functions obtained for combinations of different K values and different compensation constants N. FIG. 5 shows the transfer function obtained by using a K value of "3" and a compensation constant N causing a "1" state change. The transfer function obtained is linear over the band $f_c \pm f_c/3$. In FIG. 6, a K value of 2 is used in the circuit of FIG. 4 and the compensation constant applied N causes a "2" state change. The output of the discriminator is likewise linear over the band $f_c \pm f_c/2$. FIG. 7 shows a linear transfer function for the band 0 to $2f_c$. In this particular application, K=1 so the latches are updated at the reference frequency. By applying a compensation constant N representing a state change of "3", the range of the discriminator can be extended to $2f_c$. Finally, FIG. 8 shows the transfer function obtained when a divide-by-four counter is implemented and a compensation constant=0 is applied. This choice of counter and compensation constant reduces the circuit to the first embodiment shown in FIG. 1.

Modification of the state sequence change detector logic of FIG. 4 makes it possible to extend the operable range of the discriminator to have a nonlinear form. For example, the state change patterns may be defined as follows:

TABLE 4

| Latch 30 | Latch 32 | | Latch 30 | Latch 32 |
|---|---|---|---|---|
| 0 | 3 | | 0 | 2 |
| 1 | 0 | or | 1 | 3 |
| 2 | 1 | | 2 | 0 |
| 3 | 2 | | 3 | 1 | to produce an output at the "greater than" port 130 and

TABLE 5

| Latch 30 | Latch 32 |
|---|---|
| 0 | 1 |
| 1 | 2 |
| 2 | 3 |
| 3 | 0 | to produce an output at the "less than" port 132.

Figure 9:
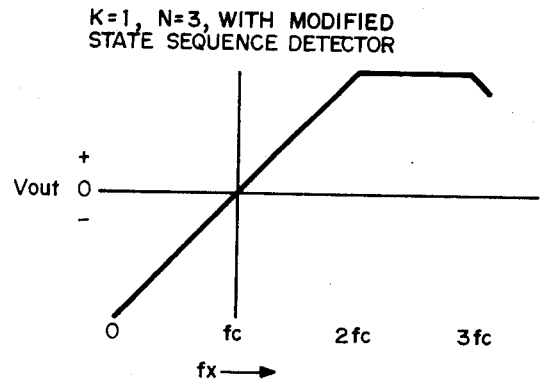
FIG. 9 is a graph of the transfer function for the discriminator of FIG. 4 having a frequency ratio constant $K=1$, a compensation constant $N=3$, and the detector logic is redefined to provide a discriminator with nonlinear output.

Under such a set of state sequence conditions, as for example, in which a compensation constant N of "3" is used and in which the counter is updated at $f_c$, K=1, the discriminator output will have the transfer function given in FIG. 9 with the discriminator output linear over the range 0 to $2f_c$ and constant over the range $2f_c$ to $3f_c$. This logic extends the bandwidth of the embodiment shown in FIG. 4 from $2f_c$ to $3f_c$.

Figure 10:
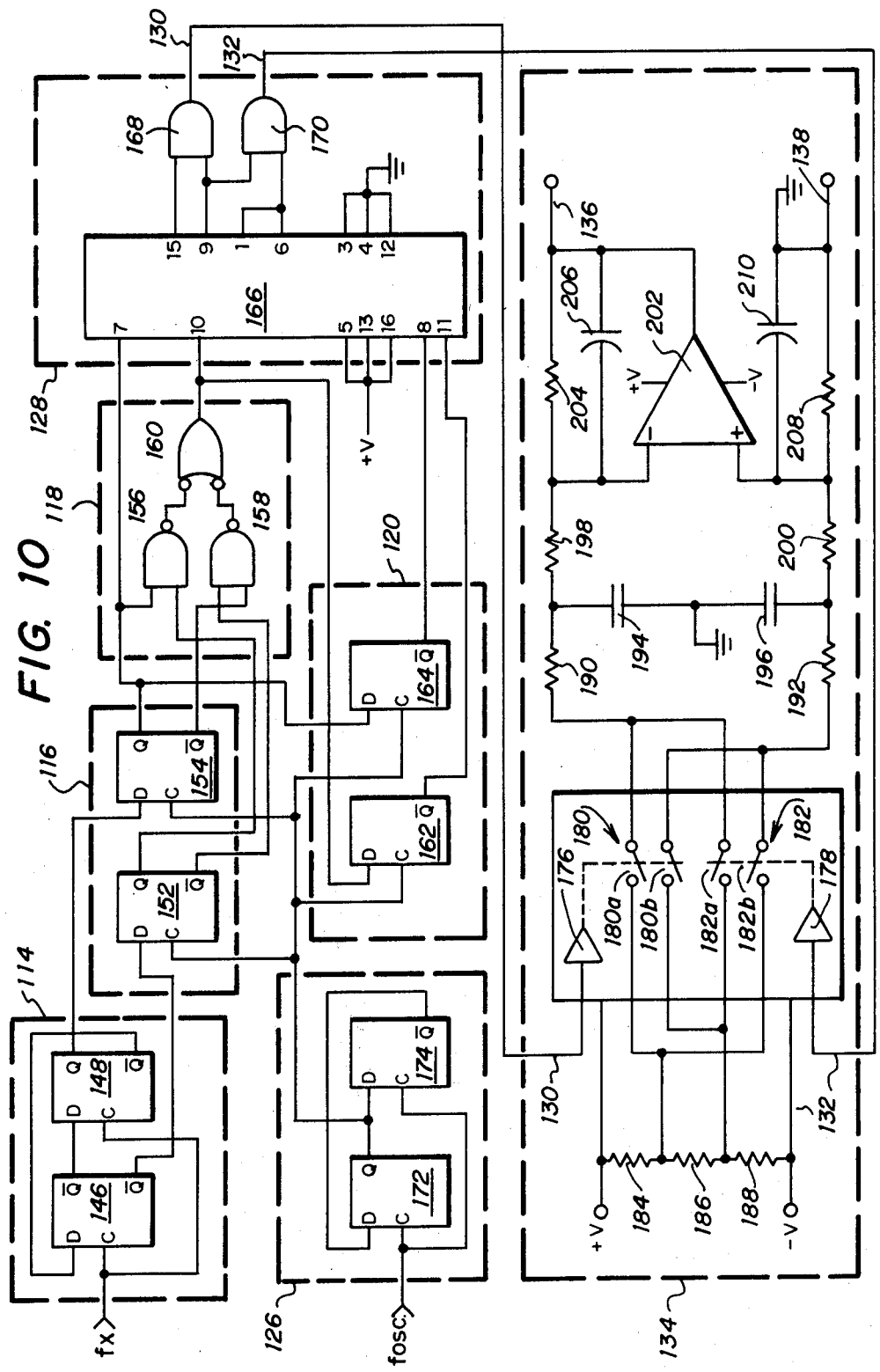
FIG. 10 is a schematic logic diagram of the digital discriminator illustrated in FIG. 4.

A further embodiment of the present invention is illustrated in schematic logic diagram format in FIG. 10. This is an implementation of the discriminator shown in FIG. 4 wherein the frequency ratio K is set to 4 and the compensation constant N is set at 0. The incoming signal $f_x$ is supplied to a counter 114 which includes flip-flop 146 and 148. Counter 114 is a Johnson counter similar to the Johnson counter 20 shown in FIG. 3. The incoming signal $f_x$ is input to the clock terminals of flip-flops 146 and 148. The Q output of flip-flop 146 is connected to the D terminal of flip-flop 148. The $\overline{Q}$ output of flip-flop 148 is connected as a feedback signal to the D terminal of flip-flop 146.

The counter 114 state signals are transmitted to the first latch 116 which includes D-type flip-flops 152 and 154. The $\overline{Q}$ output of flip-flop 146 is connected to the D terminal of flip-flop 152 while the Q output of flip-flop 148 connects to the D terminal of flip-flop 154.

In this embodiment latch 116 transmits the sampled cyclical state signal to the binary translator 118 for conversion from Johnson code to binary. Translator 118 comprises two NAND gates 156 and 158, the outputs of which are connected to drive an OR gate 160 through inverter logic on each input terminal. The inputs of NAND gate 156 are derived from the Q output of flip-flop 154 and the Q output of flip-flop 152. NAND gate 158 has its input terminals connected to the $\overline{Q}$ output of flip-flop 154 and the $\overline{Q}$ output of flip-flop 152.

Binary translator 118 is connected to drive the second latch 120 which comprises flip-flops 162 and 164. The output of OR gate 160 is connected to both the D terminal of flip-flop 162 and to one of the input terminals of state sequence change detector 128. The $\overline{Q}$ output of flip-flop 162 is also connected to state sequence change detector 128. The D terminal of flip-flop 164 is connected to receive the Q output of flip-flop 154. The $\overline{Q}$ output of flip-flop 164 is also connected to state sequence change detector 128.

In this embodiment the state sequence change detector 128 comprises a four bit parallel adder comprising a model SN5483 TTL integrated circuit. The four bit parallel adder is element 166. In addition to the previously noted input signals, this integrated circuit also receives the Q output of flip-flop 154. The inputs are received at pin terminals 7, 8, 10 and 11. The outputs of circuit 166 are generated at pin terminals 1, 6, 9 and 15 and are transmitted to AND gates 168 and 170. Pins 15 and 9 of circuit 166 are connected at the input terminals of gate 168 and pins 9 and 6 are connected respectively to the two input terminals of AND gate 170. Pin 1 of circuit 166 is tied to pin 6 of this circuit. The output of AND gate 168 is transmitted over line 130 and comprises pulses which are generated when there is a state sequence change due to the signal $f_x$ exceeding the reference frequency $f_r$. Likewise the AND gate 170 is connected to transmit its output through line 132 and this output comprises a pulse which is generated whenever the state sequence changes to indicate that the signal $f_x$ is less than the reference signal $f_r$.

The divide-by-J circuit 126 receives the oscillator signal $f_{osc}$ and comprises a pair of D-type flip-flops 172 and 174. In this embodiment circuit 126 is designed to provide a divide-by-four function to produce an output signal which is at $\frac{1}{4}$ the rate of the oscillator signal $f_{osc}$. The clock input terminals of flip-flop 172 and 174 receive the signal $f_{osc}$ while the reference signal $f_r$ is generated on the Q output terminal of flip-flop 172. The reference signal is also transmitted to the D terminal of flip-flop 174. The $\overline{Q}$ output of flip-flop 174 is connected through a return path to the D terminal of flip-flop 172. The reference signal from the Q output of flip-flop 172 is provided to the clock terminals of the flip-flops within latches 116 and 120.

The integrator 134 receives pulse signals on lines 130 and 132 which are provided respectively to driver amplifiers 176 and 178. These amplifiers operate respective two pole switches 180 and 182. As pulses are received on line 130, these pulses operate switch 180 and likewise pulses are transmitted through line 130 to operate switch 182. The input terminals of switches 180 and 182 are connected to a resistor network comprising resistors 184, 186 and 188 connected serially between positive and negative voltage terminals. The junction of resistors 184 and 186 is connected to terminals of switches 180a and 182b while the junction of resistors 186 and 188 is connected to terminals of switches 180b and 182a.

The output terminals of switches 180a and 182a are joined together and connected to a resistor 190. In similar fashion the output terminals of switches 180b and 182b are connected together and joined to a resistor 192. A pair of charge storage capacitors 194 and 196 are connected serially between the free terminals of resistors 190 and 192 with the junction of the capacitors being grounded. The capacitors 194 and 196 are charged and discharged by operation of switches 180 and 182. The amplifiers 176 and 178 together with switches 180 and 182 serve as a bipolar converter.

The signals stored on capacitors 194 and 196 are transmitted respectively through resistors 198 and 200 to the inverting and noninverting inputs of an amplifier 202. A feedback network comprising the parallel combination of a resistor 204 and a capacitor 206 connects the output of amplifier 202 to the inverting input. The input circuit to the noninverting input terminal of capacitor 202 comprises a resistor 208 in parallel with the capacitor 210 with the free end of the combination connected to ground. The analog output of the discriminator is generated between terminals 136 and 138. This signal is proportional to the frequency difference between the incoming signal $f_x$ and the reference signal $f_r$.

The circuit illustrated in FIG. 9 basically differs from that shown in FIG. 3 in the use of the binary translator 118. The binary translator converts the Johnson code produced by counter 114 into binary code which can be simply and easily processed by the readily available integrated circuit 166. The only other significant difference is the design of integrator 134 which includes a bipolar converting unit comprising the amplifiers 176 and 178 together with switches 180 and 182.

Figure 11A:
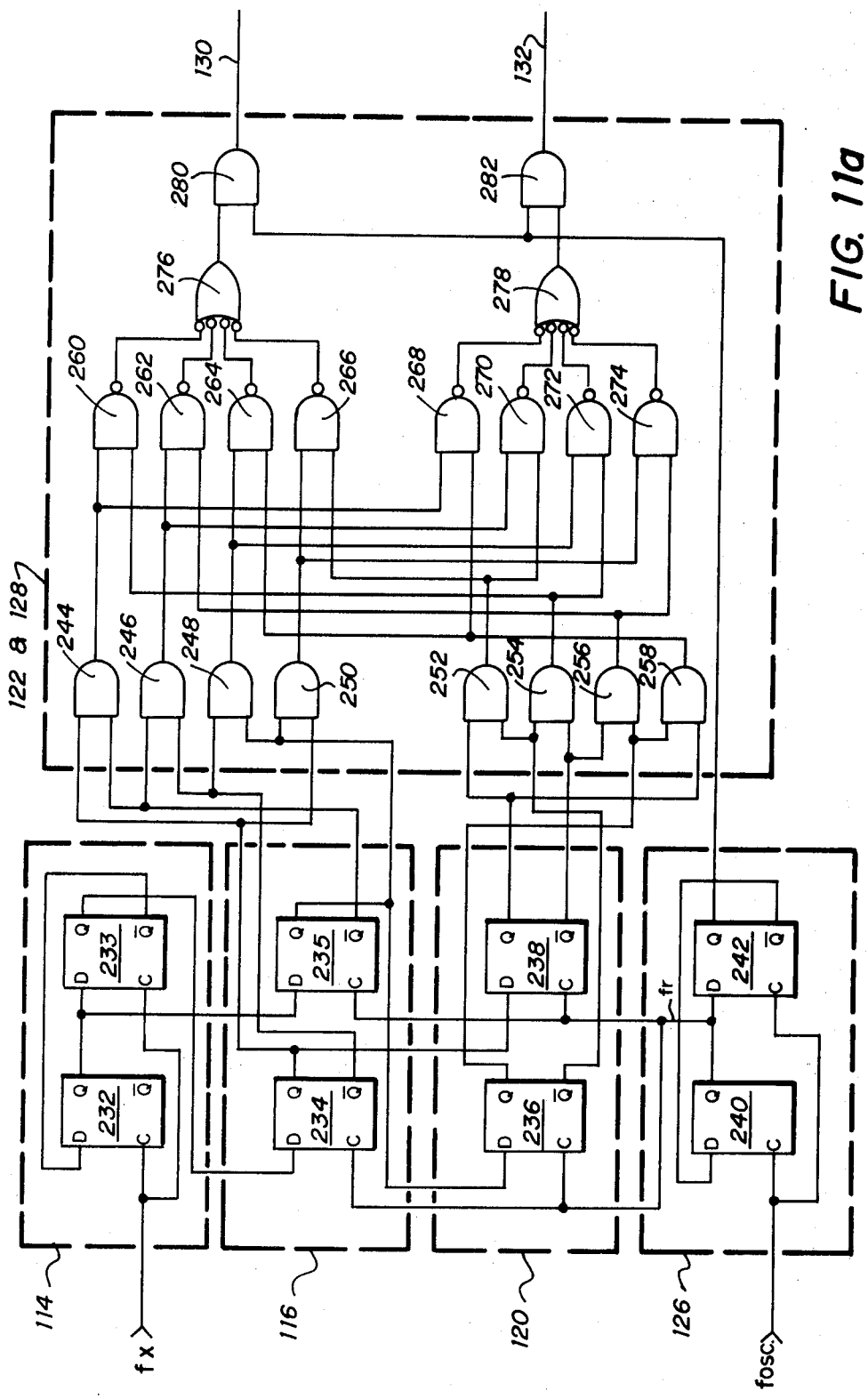
FIGS. 11a and 11b are schematic logic diagrams of the digital discriminator illustrated in FIG. 4 wherein the frequency constant ratio $K=2$ and the compensation constant $N=2$.
Figure 11B:
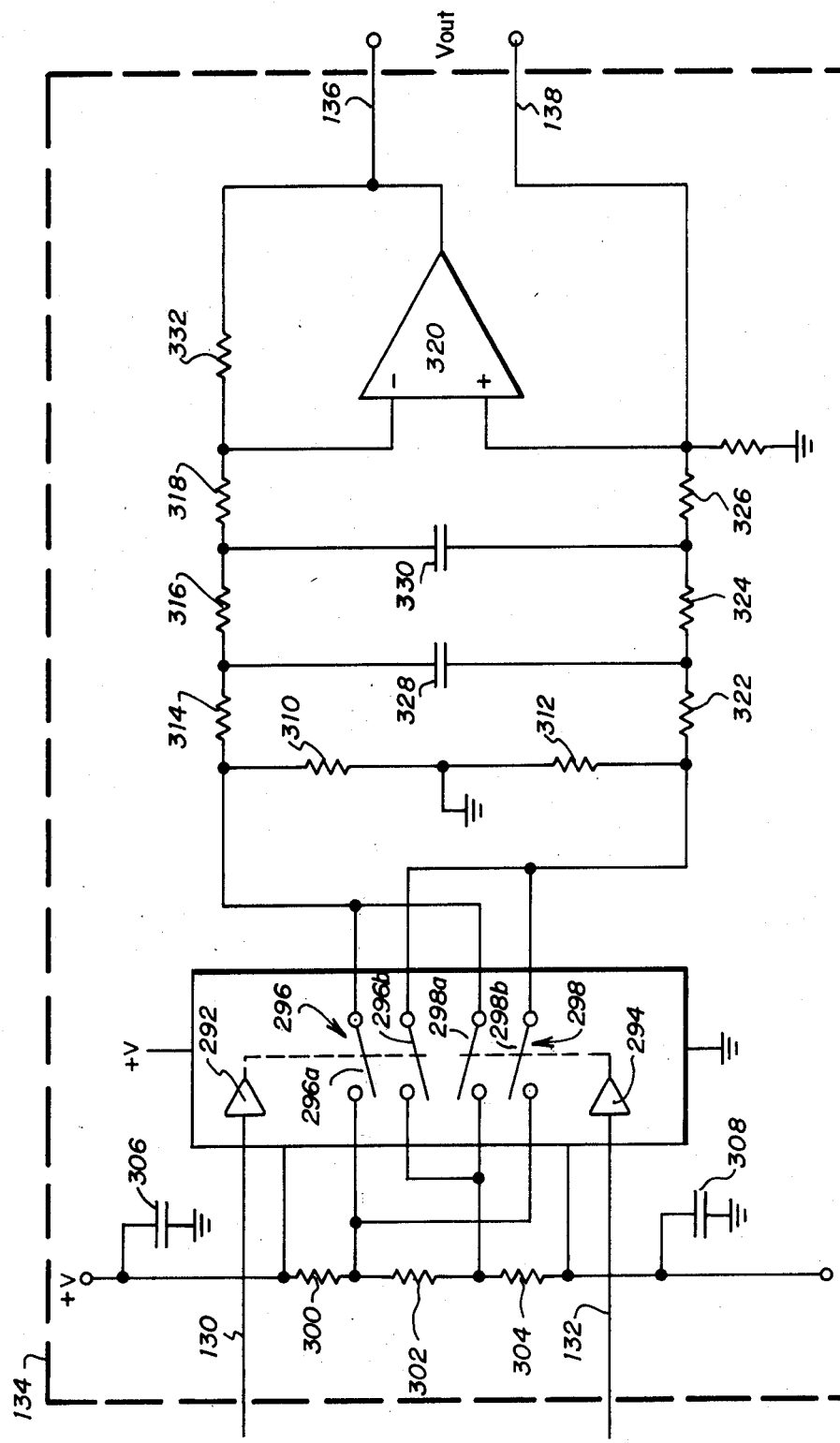

The circuit illustrated in FIGS. 11a and 11b is a further embodiment of the present invention shown in FIG. 4. The circuit in FIG. 10 has the frequency response shown in FIG. 6 wherein the frequency ratio K is set to 2 and the compensation constant N is set to 2. Note from FIG. 6 that the circuit shown in FIGS. 11a and 11b has a bandwidth equal to the center frequency $f_c$. The digital discriminator output is centered about the center frequency and extends for $\frac{1}{2}$ of this frequency along the positive and negative X-axis.

Referring now to FIGS. 11a and 11b, there is shown a further schematic diagram illustration of the present invention. The circuit of this embodiment is similar to that illustrated in FIG. 4 with the exception that the binary translator is not implemented in the circuit of FIGS. 11a and 11b. The input signal $f_x$ is a frequency modulated signal which varies in frequency between 275 KHZ and 825 KHZ and is centered about 550 KHZ.

The counter 114 comprises D-type flip-flops 232 and 233 which are connected in the same manner as shown in FIG. 10 for circuit 114. The output of counter 114 is a cyclical four state sequence Johnson code transmitted over two lines which are connected to the first latch 116.

Latch 116 comprises D-type flip-flops 234 and 235. The two lines from ring counter 114 are connected respectively to the D terminals of these flip-flops.

The two bit state stored in latch 116 is transmitted to latch 120 which comprises flip-flops 236 and 238. The state signal is transmitted from the Q terminal of flip-flop 232 to the D terminal of flip-flop 238 and from the Q terminal of flip-flop 235 to the D terminal of flip-flop 236.

The divider circuit 126 receives the oscillator signal $f_{osc}$ which in this embodiment has a frequency of 1.1 MHZ. Divider 126 consists of D-type flip-flops 240 and 242 which receive the signal $f_{osc}$ at the clock terminals for each flip-flop. The Q output terminal of flip-flop 240 is connected to the D terminal of flip-flop 242 and the $\overline{Q}$ output of flip-flop 242 is connected through a return path to the D terminal input of flip-flop 240. The reference rate signal $f_r$ is generated at the Q output of flip-flop 240 and is transmitted to the clock terminals of flip-flops 234, 235, 236 and 238.

The state sequence change detector 128 is connected to monitor the states of latches 116 and 120 and to generate an output when the state of these two latches differ. Modulo adder 122 is incorporated into detector 128 by means of logic interconnection. Detector 128 has a first set of AND gates 244–250 which receive the outputs generated by latch 116. The Q output of flip-flop 234 is connected to input terminals of AND gates 244 and 250 and the $\overline{Q}$ output of flip-flop 234 is connected to input terminals of AND gates 246 and 248. The flip-flop 235 has its Q terminal output connected to the input terminals of AND gates 248 and 250 while the $\overline{Q}$ terminal of flip-flop 235 is connected to input terminals of AND gates 244 and 246.

A second group of AND gates in detector 128 receives the outputs of latch 120. These are AND gates 252–258. The state of flip-flop 236 is transmitted from its Q terminal to input terminals of AND gates 256 and 258 and the $\overline{Q}$ output of flip-flop 236 is transmitted to input terminals of AND gate 252 and 254. The state of flip-flop 238 is transmitted to detector 128 by connecting the Q terminal of flip-flop 238 to input terminals of AND gates 252 and 258 while the $\overline{Q}$ terminal of flip-flop 238 is connected to the input terminals of AND gates 254 and 256.

Following the eight AND circuits 244–258 the detector 128 has a plurality of NAND gates 260–274. This group of NAND gates receives the outputs of AND gates 244–258 in the following manner. The output of gate 244 is connected to the inputs of NAND gates 260 and 268. AND gate 246 is connected to the inputs of NAND gates 262 and 270. The output of AND gate 248 is connected to the inputs of NAND gates 264 and 272. Gate 250 supplies the inputs to NAND gates 266 and 274. The AND gate 252 supplies inputs to NAND gates 266 and 270. The output of AND gate 254 is connected to the input terminals of NAND gates 260 and 272. AND gate 258 is connected via its output terminal to the input terminals of NAND gates 264 and 268.

The outputs of NAND gates 260–266 are connected to the input terminals of an OR gate 276 through input terminal invertors and the output terminals of NAND gates 268–274 are connected to the input terminals of an OR gate 278 through input terminal invertors. The output from OR gate 276 is provided as the first input to an AND gate 280. The OR gate 278 provides a first input to an AND gate 282. A clock signal at a nominal rate of 275 KHZ is supplied by the divider circuit 126 to the second input terminals of AND gates 280 and 282. This clock signal is phase offset from the reference signal provided to gate the latches 116 and 120. The signal produced at the output of AND gate 280 is transmitted through line 130 and comprises a pulse which is generated whenever a state sequence change is detected between latches 116 and 120 to indicate that the signal $f_x$ has exceeded the frequency of center frequency $f_c$. In a like manner the output of AND gate 282 is transmitted through line 132 and comprises a pulse which indicates that the frequency of signal $f_x$ has become less than the center frequency signal $f_c$.

The modulo adder 122 included in the circuit shown in FIG. 4 has been incorporated into the logic which comprises the state sequence change detector 128 and does not comprise a separate distinct group of logic gates. The modulo adder in this instance advances the apparent state of latch 116 by two states. This increases the bandwidth of the system to that shown in FIG. 6.

The pulse signals generated on line 130 and 132 are transmitted to the analog integrator 134. This integrator works in essentially the same manner as the integrator disclosed in FIG. 10.

The pulse signals on lines 130 and 132 are transmitted respectively to amplifiers 292 and 294 which respectively operate the two pole switches 296 and 298. The two pole switch 296 includes individual switches 296a and 296b and in the same fashion two pole switch 298 includes switches 298a and 298b. The input terminals to switches 296 and 298 are connected to a series group of resistors 300–304 which are connected between the positive and negative voltage sources. Bypass capacitors 306 and 308 are also connected to these power sources. The junction of resistors 300 and 302 is connected to switch 296a and switch 298b. The junction of resistors 302 and 304 is connected to 296b and switch 298a. The outputs of switches 296a and 298a are joined together and connected to the first terminal of a resistor 310. Likewise the switches 296b and 298b are joined together and connected to the first terminal of a resistor 312. The free terminals of resistors 310 and 312 are each connected to ground. The common terminals of switches 296a and 298a are connected through the series combination of resistors 314, 316 and 318 to the inverting input of an amplifier 320. The common terminal of switches 296b and 298b is connected through the series combination of resistors 322, 324 and 326 to the noninverting input of amplifier 320.

A capacitor 328 is connected at one terminal of the junction of resistors 314 and 316 and at the second terminal to the junction of resistors 322 and 324. A second capacitor 330 is connected at one terminal to the junction of resistors 316 and 318 and at the second terminal to the junction of resistors 324 and 326. A feedback resistor 332 is connected between the output terminal of amplifier 320 and the inverting input terminal of the amplifier. The output signal of the discriminator is produced between terminals 136 and 138. This signal, as described above, is an analog signal which is proportional to the frequency difference between the incoming signal $f_x$ and the center frequency signal $f_c$.

It will thus be apparent to one skilled in the art that other modifications of the logic of the state sequence detector can be made to obtain different transfer functions, depending upon the application. Other counters may be used such as Johnson counters with more or less than four states, or other types of counters satisfying the criteria set out above. Use of weighing factors for various state sequences detected and different types of integration will provide nearly any effective bandwidth and/or transfer functions desired.

The wideband digital discriminator described in FIGS. 1 and 4 herein has wide deviation capability, is highly linear and has relatively wide bandwidths which may be easily modified by simple changes in the circuit hardware. The discriminator has the additional advantages of almost total digital implementation and remote programability by changing the reference frequency.

Linear Phase And Frequency Detector

The digital discriminator circuit disclosed herein may be further modified with the addition of a conventional phase detector to provide a finely tuned phase and frequency detector. While the maximum frequency difference detectable by the discriminator depends upon the choice of the counter, the frequency ratio K and upon the compensation constant N applied, the minimum resolution of the discriminator is a single state change which represents a phase difference of $2\pi$ radians. To improve the resolution, a conventional phase detector is added to the circuit to resolve phase differences less than $2\pi$ radians down to the minimum resolution of the phase detector. Fine phase and frequency resolution is especially important in applications such as wide range phase lock loops. In most phase and frequency detectors currently in use, the output is highly nonlinear and the error signal does not increase significantly beyond $2\pi$ radians. By providing a phase and frequency detector which has wide frequency difference resolution as well as good minimum resolution, a much improved acquisition rate in phase lock loops is possible.

Figure 12:
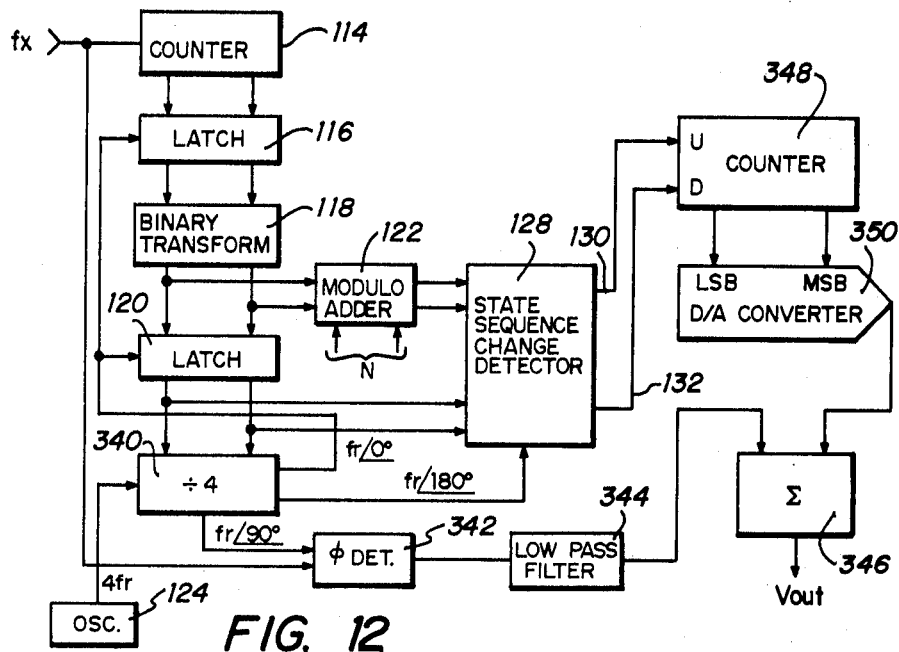
FIG. 12 is a block diagram of a linear digital phase and frequency detector.

Referring now to the FIG. 12, the digital discriminator circuit of FIG. 4 has been modified to include a linear digital phase and frequency detector. The divide-by-J circuit of block 126 is replaced by a Johnson divide-by-four counter 340 which provides quadratured subdivided signals at one fourth frequency. The Johnson divide-by-four counter 340 is dictated by the need for quadratured signals to get the output of a phase detector 342 in step with the discriminator output. Oscillator 124 is operated at $4f_c$ so that latches 116 and 120 and detector 128 are clocked at the reference frequency $f_r$. As shown in FIG. 12, a subdivided frequency $f_r$ updates latches 116 and 120. A second subdivided signal of frequency $f_r$ phase related with the oscillator signal $4f_r$ is input to the conventional phase detector 342, and a third subdivided signal of frequency $f_r$ drives the state sequence detector 128. Theoretical phase angles are shown in FIGS. 12 for the three subdivided frequencies of Johnson counter 340, although in practice, some phase trimming may be necessary.

Figure 13:
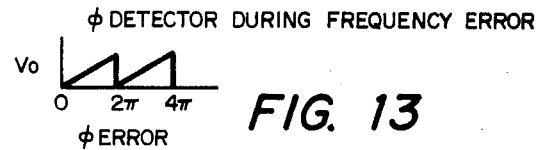
FIG. 13 is a graph of the output of the phase detector shown in FIG. 12 as a function of phase angle.

Incoming signal $f_x$ and the reference signal $f_r$ are input into the linear phase detector 342 which has the linear transfer function shown in FIG. 13. Phase detector 342 may be implemented by digital TTL logic such as a two-input exclusive OR gate, TTL7486, manufactured by Texas Instruments. The output of detector 342 is input into a low pass filter 344 such as an active filter or an RC circuit designed for the particular frequencies in use. The output of filter 344, an analog signal representing the phase difference between the incoming signal and center frequency, is then summed in a summing circuit 346 with an analog signal representing the frequency difference between the incoming signal and center frequency to provide a finely tuned phase and frequency difference signal.

Pulses are output by detector 128 at a rate proportional to the frequency deviation $\Delta f$. The output of state sequence change detector 128 is applied to an up/down counter 348 which counts up and down in response to pulses from the "greater than" port 130 and the "less than" port 132 of detector 128. Counter 348 produces a step function output corresponding to the frequency difference between the incoming signal and center frequency. Counter 348 may be an integrated circuit such as TTL74191 or TTL74192, manufactured by Texas Instruments. The output of up/down counter 348 is then applied to a digital-to-analog converter 350 which outputs an analog signal indicative of the detected frequency difference. A digital-to-analog converter suitable for this task is an integrated circuit such as DAC08, manufactured by Analog Devices, or a suitably designed R-2R ladder network. The output of the digital-to-analog converter 350 is summed with the output from integrator 46 in summing circuit 346 to produce an output signal finely tuned to the frequency and phase difference between the incoming signal and the center frequency. An operational amplifier, such as 741, manufactured by National Semiconductor, will be satisfactory in many applications for the summing circuit 346.

Figure 14A:
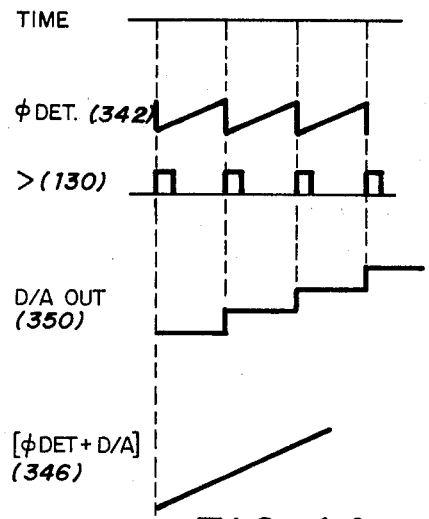
FIGS. 14a and 14b show respectively the output of the phase detector, the state change detector, the converter and the resulting phase and frequency output for detected frequencies greater than and less than the reference frequency.
Figure 14B:
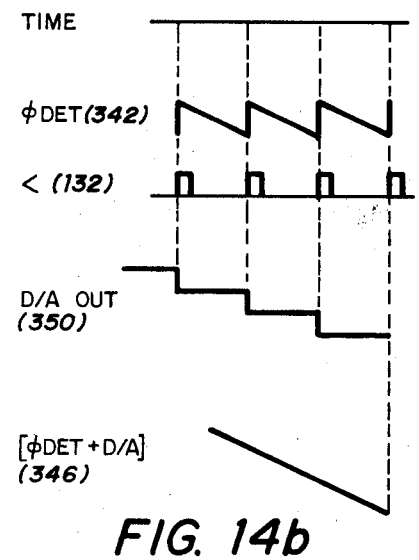

FIGS. 14a and 14b show the output of the phase detector 342, "greater than" and "less than" ports 130 and 132, and the outputs of digital-to-analog converter 350 and summing circuit 346. FIG. 14a shows each of these outputs for incoming signals $f_x$ whose frequency exceeds the center frequency $f_c$ and FIG. 14b shows of each of these outputs for incoming signals $f_x$ whose frequencies are less than the center frequency $f_c$.

This circuit permits phase and frequency detection in ranges which exceed $\pm \pi$ radians and eliminates or reduces the prepositioning requirement in phase lock loops. It also results in the simplification of variable loop response systems which are sometimes used to solve the prepositioning problem. Moreover, it leads to improved acquisition rates and overall loop stability.

While certain types of logic have been described herein by way of example, it is understood that the actual hardware used will be dictated by operating frequencies, power requirements, and characteristics of the system in which the detector is to be used.

Although particular embodiments of the invention have been described herein, it will be understood that the invention is not limited to the embodiments disclosed, but is capable of rearrangement, modification and substitution of parts and elements without departing from the spirit of the invention.

I claim:

1. A wideband digital discriminator for demodulating an FM signal comprising:
   (a) timing means for producing a reference signal of known frequency;
   (b) counting means operative at the rate of the FM signal for generating at the output thereof a cyclical signal comprising a repeated series of nonambiguous states;
   (c) means for sampling the state of the cyclical signal generated at the output of said counting means at a rate determined by said reference signal and for storing at least two consecutive sampled states of said cyclical signal; and
   (d) detection means operating at a rate determined by said reference signal and connected to receive said stored sampled states for detecting a state difference between the sampled states of said cyclical signal, said detection means generating an output signal when a state difference is detected.

2. The discriminator recited in claim 1 wherein said detection means detects the direction of said state difference and said direction information is included in said output signal.

3. The discriminator recited in claim 1 wherein said counting means is a Johnson counter.

4. The discriminator recited in claim 1 wherein said output signal is pulsed and including analog integration means connected to receive said output signal and generate an analog discrimination output signal therefrom.

5. The discriminator recited in claim 1 wherein said stored sampled states are stored in a first latch connected to receive said cyclical signal from said counting means and a second latch connected to receive the stored cyclical signal from said first latch.

6. The discriminator recited in claim 1 including means for translating the output signal states of said counting means into a binary coded signal.

7. The discriminator recited in claim 1 including means connected to receive the cyclical state output signal of said counting means and generate a state signal advanced by a predetermined number of states from said state output of said counting means, said advanced state signal transmitted to said detection means.

8. A digital discriminator for demodulating an FM signal comprising:

(a) means for producing a reference signal having a period which is related to the period of the center frequency of the FM signal;

(b) counting means operative at the rate of the FM signal for generating at the output thereof a cyclical signal comprising a repeated series of nonambiguous states;

(c) means for sampling the state of the cyclical signal generated at the output of said counting means at a rate determined by said reference signal and for storing at least two consecutive sampled states of said cyclical signal; and (d) detection means operating at a rate determined by said reference signal and connected to receive said stored sampled states for detecting a state difference between the sampled states of said cyclical signal, said detection means generating an output signal when a state difference is detected.

9. A digital discriminator as recited in claim 8 including means connected to receive the state output of said counting means and generate a state signal advanced by a predetermined number of states from said state output of said counting means, said advanced state signal transmitted to said detection means.

10. A digital discriminator for demodulating an FM signal comprising:

(a) a counter operating at the frequency of the FM signal for generating a cyclical output signal comprising a predetermined number of sequential nonambiguous states;

(b) means for generating a reference signal;

(c) first and second latches for storing states of said cyclical signal, said first latch actuated synchronously with said reference signal for sampling and storing the present state of said cyclical signal, said second latch actuated synchronously with said reference signal for sampling and storing the state signal stored in said first latch to obtain the immediately preceding sampled state of said cyclical signal; and (d) detection means actuated synchronously with said reference signal and connected to receive the state signal stored in said first latch and said second latch, said detection means generating an output signal when the two state signals received by said detection means are different.

11. The discriminator recited in claim 10 including an integrator for receiving the output signal of said detection means and generating an analog output signal proportional to the frequency deviation of said FM signal.

12. The discriminator recited in claim 10 wherein the output signal of said detection means indicates the direction of the change in said state signals received by said detection means.

13. The discriminator recited in claim 10 wherein said counter is a Johnson divide-by-four counter.

14. The discriminator recited in claim 10 including means connected between said first latch and said detection means for translating the state signal from said first latch into binary code.

15. A discriminator as recited in claim 10 wherein said detection means includes a first output port and a second output port, said detection means generating a pulse on said first port when an increasing state difference is detected and generating a pulse on said second port when a decreasing state difference is detected.

16. A discriminator as recited in claim 15 including a resistor-capacitor integrator connected to said first and second ports for charging said capacitor by said pulses to produce an analog output signal proportional to the frequency deviation of said FM signal.

17. A digital discriminator for demodulating an FM signal comprising:

(a) a counter operating at the frequency of the FM signal for generating a cyclical output signal comprising a predetermined number of sequential nonambiguous states;

(b) means for generating a reference signal;

(c) first and second latches for storing states of said cyclical signal, said first latch actuated synchronously with said reference signal for sampling and storing the present state of said cyclical signal, said second latch actuated synchronously with said reference signal for sampling and storing the state signal stored in said first latch to obtain the immediately preceding sampled state of said cyclical signal;

(d) means for receiving the state signal stored in said first latch and generating a state signal corresponding to a state of said sequential nonambiguous states advanced by a predetermined number of states from the state received from said first latch; and (e) detection means actuated synchronously with said reference signal and connected to receive the state signal stored in said second latch and the advanced state signal generated by said means for receiving, said detection means generating an output signal when the two state signals received by said detection means are different, said output signal indicating whether said state change is increasing or decreasing.

18. The discriminator recited in claim 17 including an integrator for receiving the output signal of said detection means and generating an analog output signal proportional to the frequency deviation of said FM signal.

19. The discriminator recited in claim 17 wherein said counter is a Johnson divide-by-four counter.

20. The discriminator recited in claim 17 wherein said means for receiving is a modulofour adder for adding a predetermined number to the state signal received from said first latch.

21. The discriminator recited in claim 17 including means connected between said first latch and said means for receiving for translating the state signal in said first latch into binary code.

22. A discriminator as recited in claim 17 wherein said detection means includes a first output port and a second output port, said detection means generating a pulse on said first port when an increasing state difference is detected and generating a pulse in said second port when a decreasing state difference is detected.

23. A discriminator as recited in claim 22 including a resistor-capacitor integrator connected to said first and second ports for charging said capacitor by said pulses to produce an analog output signal proportional to the frequency deviation of said FM signal.

24. A wideband digital discriminator for demodulating an FM signal comprising:

(a) a ring counter for generating in synchronism with the FM signal a cyclical signal having recurring X number of sequential nonambiguous states;

(b) means for generating a reference signal where K is the ratio of the center frequency of the FM signal to the frequency of the reference signal;

(c) means for sampling the state of said cyclical signal in synchronism with said reference signal and for storing the present and immediately preceding sampled state of said cyclical signal;

(d) means for generating an advanced state signal having a state of said nonambiguous states advanced N states ahead of said present sampled cyclical state where N+K=X;

(e) means for detecting a state difference between said advanced state and said preceding state; and (f) means for generating an output signal when a state difference is detected.

25. Apparatus for measuring the phase and frequency difference between an FM signal and a reference signal comprising:

(a) counting means operating at the frequency of the FM signal for generating at the output thereof a cyclical signal having a recurring series of nonambiguous states;

(b) means for generating a reference signal having a known frequency;

(c) means for sampling the state of the cyclical signal generated at the output of said counting means at a rate determined by said reference signal and for storing the present sampled state and immediately preceding sampled state;

(d) detection means operating at a rate determined by said reference signal and connected to receive said stored sampled states for detecting a state change between said stored sampled states and the direction of said change, said detection means generating an output signal which indicates the detection of a state change and the direction thereof;

(e) means for detecting the phase difference between the FM signal and the reference signal and generating a phase signal proportional to said phase difference; and (f) means for summing said output signal and said phase signal to produce a phase and frequency difference signal representing the phase and frequency difference between the FM signal and the reference signal.

26. Apparatus as recited in claim 25 wherein said output signal has a pulse format and an up/down counter receives the output signal and generates a count output which is provided to a digital-to-analog converter that generates an analog frequency difference signal which is summed in a summing circuit with the phase signal to produce the phase and frequency difference signal.

27. Apparatus as recited in claim 25 including means connected to receive said stored sampled states for translating the states of said stored sampled states into binary code for transfer to said detection means.

28. Apparatus as recited in claim 25 including means connected to receive one of said stored sampled states for advancing the state thereof and transferring the advanced state to said detection means.

29. A method for demodulating an FM signal comprising the steps of:

(a) generating a reference signal;

(b) generating a cyclical signal having a repeated series of sequential nonambiguous states, said cyclical signal being generated in synchronism with said FM signal;

(c) sampling the state of said cyclical signal in synchronism with said reference signal;

(d) comparing the current sampled state of said cyclical signal with the immediate preceding sampled state of said cyclical signal to detect a change of state; and (e) generating an output signal when said change of state is detected.

30. The method recited in claim 29 wherein the step of comparing includes detecting the direction of the change of state and the step of generating an output signal includes designating the direction of the change of state in the output signal.

31. The method recited in claim 29 wherein the step of generating a cyclical signal comprises generating a four state Johnson code.

32. The method recited in claim 29 wherein the step of generating an output signal comprises generating pulses on first and second ports and integrating these pulses to produce an analog signal proportional to the frequency deviation of said FM signal.

33. The method recited in claim 29 including the step of translating the states of said sampled cyclical signal into binary code for use in said step of comparing.

34. The method recited in claim 29 including the step of advancing the state of said sampled cyclical signal by a predetermined number of states and the step of comparing comprises detecting a state difference between the immediately preceding sampled state and the advanced state of said cyclical signal.

35. The method recited in claim 29 wherein the period of said reference signal is related to the period of the center frequency of said FM signal.

36. A method for measuring the phase and frequency difference between an FM signal and a reference signal comprising the steps of:

(a) generating a cyclical signal having a recurring series of nonambiguous states, said cyclical signal generated in synchronism with the FM signal;

(b) sampling the state of said cyclical signal in synchronism with the reference signal and storing the present and immediately preceding sampled states of said cyclical signal;

(c) detecting a state change between said stored sampled states and detecting the direction of state change, said state change indicating a frequency difference between said FM signal and said reference signal;

(d) generating an output signal when a state change is detected, said output signal indicating said direction of state change;

(e) measuring the phase difference between said FM signal and said reference signal and generating a phase signal proportional to said phase difference; and (f) summing said output signal and said phase signal to produce a phase and frequency difference signal proportional to the phase and frequency difference between the FM signal and the reference signal.

37. A method as recited in claim 36 wherein said output signal is generated in a pulse format, said pulsed output signal is counted in an up/down counter to produce a digital output which is converted to an analog frequency difference signal which is summed with said phase signal to produce said phase and frequency difference signal.

* * * * *